United States Patent
Bedell et al.

(10) Patent No.: US 8,933,515 B2
(45) Date of Patent: Jan. 13, 2015

(54) DEVICE STRUCTURE, LAYOUT AND FABRICATION METHOD FOR UNIAXIALLY STRAINED TRANSISTORS

(75) Inventors: Stephen W. Bedell, Yorktown Heights, NY (US); Huiming Bu, Albany, NY (US); Kangguo Cheng, Albany, NY (US); Bruce B. Doris, Yorktown Heights, NV (US); Johnathan E. Faltermeier, Albany, NY (US); Ali Khakifirooz, Albany, NY (US); Devendra K. Sadana, Yorktown Heights, NY (US); Chun-Chen Yeh, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/531,175

(22) Filed: Jun. 22, 2012

(65) Prior Publication Data

US 2012/0261762 A1    Oct. 18, 2012

Related U.S. Application Data

(62) Division of application No. 12/689,346, filed on Jan. 19, 2010, now Pat. No. 8,288,218.

(51) Int. Cl.
| | | |
|---|---|---|
| *H01L 27/088* | (2006.01) | |
| *H01L 21/8238* | (2006.01) | |
| *H01L 27/02* | (2006.01) | |
| *H01L 29/66* | (2006.01) | |
| *H01L 29/78* | (2006.01) | |

(52) U.S. Cl.
CPC *H01L 21/823807* (2013.01); *H01L 21/823814* (2013.01); *H01L 27/0207* (2013.01); *H01L 29/6656* (2013.01); *H01L 29/66628* (2013.01); *H01L 29/78* (2013.01); *H01L 29/7843* (2013.01); *H01L 29/7848* (2013.01)
USPC ................................. 257/368; 257/E27.06

(58) Field of Classification Search
USPC ............................................................ 257/368
See application file for complete search history.

(56) References Cited

U.S. PATENT DOCUMENTS

| | | | |
|---|---|---|---|
| 6,815,278 | B1 | 11/2004 | Ieong et al. |
| 7,098,508 | B2 | 8/2006 | Ieong et al. |
| 7,271,043 | B2 | 9/2007 | Zhu et al. |

(Continued)

OTHER PUBLICATIONS

Ghani, T., et al. "A 90NM High Volume Manufacturing Logic Technology Featuring Novel 45NM Gate Length Strained Silicon CMOS Transistors" 2003 IEEE. IEEE International Electron Devices Meeting, 2003. IEDM 2003 Technical Digest. Dec. 2003. pp. 978-980.

(Continued)

*Primary Examiner* — Alexander Ghyka
(74) *Attorney, Agent, or Firm* — Tutunjian & Bitetto, P.C.; Louis J. Percello

(57) ABSTRACT

A semiconductor device and method for fabricating a semiconductor device include providing a strained semiconductor layer having a first strained axis, forming an active region within a surface of the strained semiconductor layer where the active region has a longitudinal axis along the strained axis and forming gate structures over the active region. Raised source/drain regions are formed on the active regions above and over the surface of the strained semiconductor layer and adjacent to the gate structures to form transistor devices.

16 Claims, 9 Drawing Sheets

(56) References Cited

U.S. PATENT DOCUMENTS

| | | | |
|---|---|---|---|
| 7,279,756 | B2 | 10/2007 | Wang et al. |
| 7,307,273 | B2 | 12/2007 | Currie |
| 7,361,539 | B2 | 4/2008 | Chen et al. |
| 2005/0285187 | A1 | 12/2005 | Bryant et al. |
| 2006/0266996 | A1 | 11/2006 | Irisawa et al. |
| 2007/0111417 | A1 | 5/2007 | Bryant et al. |
| 2007/0262361 | A1 | 11/2007 | Zhu et al. |
| 2007/0262385 | A1 | 11/2007 | Nguyen et al. |
| 2008/0124858 | A1 | 5/2008 | Nguyen et al. |

OTHER PUBLICATIONS

Harris, H., et al. "Band-Engineered Low PMOS VT With High-K/Metal Gates Featured in a Dual Channel CMOS Integration Scheme" 2007 Symposium on VLSI Technology Digest of Technical Papers. Jun. 2007. pp. 154-155.

Hashemi, P., et al. "Electron Transport in Gate-All-Around Uniaxial Tensile Strained-Si Nanowire N-MOSFETs. "IEDM 2008. IEEE International Electron Device Meeting (IEDM'08). Dec. 2008. (4 pages).

Irisawa, T., et al. "Electron Transport Properties of Ultrathin-Body and Tri-Gate SOI NMOSFETs With Biaxial and Uniaxial Strain" International Electron Devices Meeting, IEDM '06. Dec. 2006. (4 Pages).

Irisawa, T., et al. "High-Performance Uniaxially Strained Sige-on-Insulator PMOSFETs Fabricated by Lateral-Strain-Relaxation Technique" 2006 IEEE. IEEE Transactions on Electron Devices. vol. 53, No. 11. Nov. 2006, pp. 2809-2815.

Irisawa, T., et al. "Uniaxially Strained SGOI and SSOI Channels for High Performance Multi-Gate CMOS", Symp. ECS. Third International SiGe, Ge, & Related Compounds Symposium. Oct. 2008. (1 Page).

Loo, R., et al. "Selective Epitaxial SI/SIGE Growth for VT Shift Adjustment in High-K PMOS Devices" Semiconductors Science and Technology. Jan. 2007. pp. S110-S113.

Luo, Z., et al. "High Performance and Low Power Transitors Integrated in 65NM Bulk CMOS Technology" 2004 IEEE International Conference on Services Computing (SCC 2004). Sep. 2004. pp. 661-664.

Luo, Z., et al. "High Performance Transistors Featured in Aggressively Scaled 45NM Bulk CMOS Technology" 2007 Symposium on VLSI Technology Digest of Technical Papers. Jun. 2007. pp. 16-17.

Nguyen, B., et al. "Uniaxial and Biaxial Strain for CMOS Performance Enhancement" 2006 IEEE. 2006 IEEE International Conference on Services Computing (SCC 2006). Sep. 2006. (3 pages).

Ren, Z., et al. "On Implementation of Embedded Phosphorus-Doped SIC Stressors in SOI NMOSFETs" 2008 Symposium on VLSI Technology Digest for Technical Papers. Jun. 2008. pp. 172-173.

Rim, K., et al. "Characteristics and Device Design of Sub-100 NM Strained Si N- and PMOSFETs," 2002 Symposium on VLSI Technologies Digest of Technical Papers. Jun. 2002. pp. 98-99.

Shi, Z., et al. "Mobility Enhancement in Surface Channel SIGE PMOSFETs With HFO2 Gate Dielectrics." 2003 IEEE. IEEE Electron Device Letters. vol. 24, No. 1. Jan. 2003. pp. 34-36.

Thean, A., et al., "Strain-Enhanced CMOS Through Novel Process-Substrate Stress Hybridization of Super-Critically Thick Strained Silicon Directly on Insulator (SC-SSOI)". 2006 Symposium on VLSI Technology Digest of Technical Papers. Jun. 2006. pp. 130-131.

Weber, O., et al. "55NM High Mobility Sige(:C) PMOSFETs With HFO2 Gate Dielectric and Tin Metal Gate for Advanced CMOS" 2004 Symposium on VSLI Technology Digest of Technical Papers. Jun. 2004. pp. 42-43.

Yin, H., et al., "Integration of Local Stress Techniques With Strained-Si Directly on Insulator (SSDOI) Substrates" 2006 Symposium on VSLI Technology Digest of Technical Papers. Jun. 2006. pp. 76-77.

Yin, H., et al., "Uniaxial Strain Relaxation on Ultra-Thin Strained-Si Directly on Insulator (SSDOI) Substrates" 2006 IEEE. ICSICT. 8th International Conference on Solid-State and Integrated Circuit Technology. Oct. 2006. pp. 136-138.

DEVICE STRUCTURE, LAYOUT AND FABRICATION METHOD FOR UNIAXIALLY STRAINED TRANSISTORS

RELATED APPLICATION INFORMATION

This application is a Divisional application of co-pending U.S. patent application Ser. No. 12/689,346 filed on Jan. 19, 2010, incorporated herein by reference in its entirety.

BACKGROUND

1. Technical Field

The present invention relates to semiconductor fabrication and more particularly to uniaxially strained transistors and methods for fabrication thereof.

2. Description of the Related Art

Epitaxially grown SiGe channels are being used to tune threshold voltages of p-type metal oxide semiconductor field effect transistors (PMOSFETs) in high-k/metal gate CMOS. If grown on a large Si island, the SiGe channel is under biaxial compressive strain. However, most transistors in a state-of-the-art integrated circuit are narrow, with a width typically less than 500 nm. When transistors are fabricated on individual active areas, the length of the active area is also small (typically 200 nm or less). So, the biaxial compressive strain in the SiGe is almost completely relaxed.

A typical state-of-the-art PMOSFET may contain an embedded SiGe structure in a source/drain (S/D) area to apply uniaxial compressive strain to the channel and to lower the parasitic resistance of the device. However, when used on individual SiGe-channel PMOSFETs, where the strain in the SiGe channel is already relaxed, the embedded SiGe process does not apply significant stress on the SiGe channel. Furthermore, the embedded SiGe process requires that a recess is made in the S/D area first, and then filled with epitaxially grown SiGe. However, once the channel SiGe is etched to form the recess, most of the built-in stress in this layer is relaxed.

In other words, with the embedded SiGe process, the strain relaxation of the SiGe channel is inevitable and due to the small difference in the lattice constant of the embedded SiGe and channel SiGe materials, the strain transferred to the channel is also small.

SUMMARY

A semiconductor device and method for fabricating a semiconductor device include providing a strained semiconductor layer having a first strained axis, forming an active region within a surface of the strained semiconductor layer where the active region has a longitudinal axis along the strained axis and forming gate structures over the active region. Raised source/drain regions are formed on the active regions above and over the surface of the strained semiconductor layer and adjacent to the gate structures to form transistor devices.

Another method for fabricating a semiconductor device includes providing a strained semiconductor layer having a first strained axis; forming an active region within a surface of the strained semiconductor layer by doping the active region for forming transistor channels where the active region has a longitudinal axis along the strained axis; forming gate structures over the active region; forming first spacers on the gate structures; forming raised source/drain regions on the active regions above and over the surface of the strained semiconductor layer and adjacent to the gate structures to form transistor devices having a strained channel; and forming second spacers over the first spacers and a portion of the raised source/drain regions.

A semiconductor device includes a strained semiconductor layer having a first strained axis. An active region is formed within a surface of the strained semiconductor layer where the active region has a longitudinal axis along the strained axis. Gate structures are formed over the active region. Raised source/drain regions are formed on the active region above and over the surface of the strained semiconductor layer and adjacent to the gate structures to form transistor devices.

A semiconductor device includes a strained semiconductor layer having a first strained axis. An active region is formed within a surface of the strained semiconductor layer where the active region has a longitudinal axis along the strained axis. Gate structures are formed over the active region. First spacers are formed on the gate structures. Raised source/drain regions are formed on the active region above and over the surface of the strained semiconductor layer and adjacent to the gate structures to form transistor devices. Second spacers are formed over the first spacers and a portion of the raised source/drain regions.

A semiconductor device includes a strained semiconductor layer having a first strained axis. An active region is formed within a surface of the strained semiconductor layer where the active region has a longitudinal axis along the strained axis. Dielectric material is formed around the active region. Gate structures are formed over the active region. First spacers are formed on the gate structures. Raised source/drain regions are formed on the active region above and over the surface of the strained semiconductor layer and adjacent to the gate structures to form transistor devices. Second spacers are formed over the first spacers and a portion of the raised source/drain regions.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
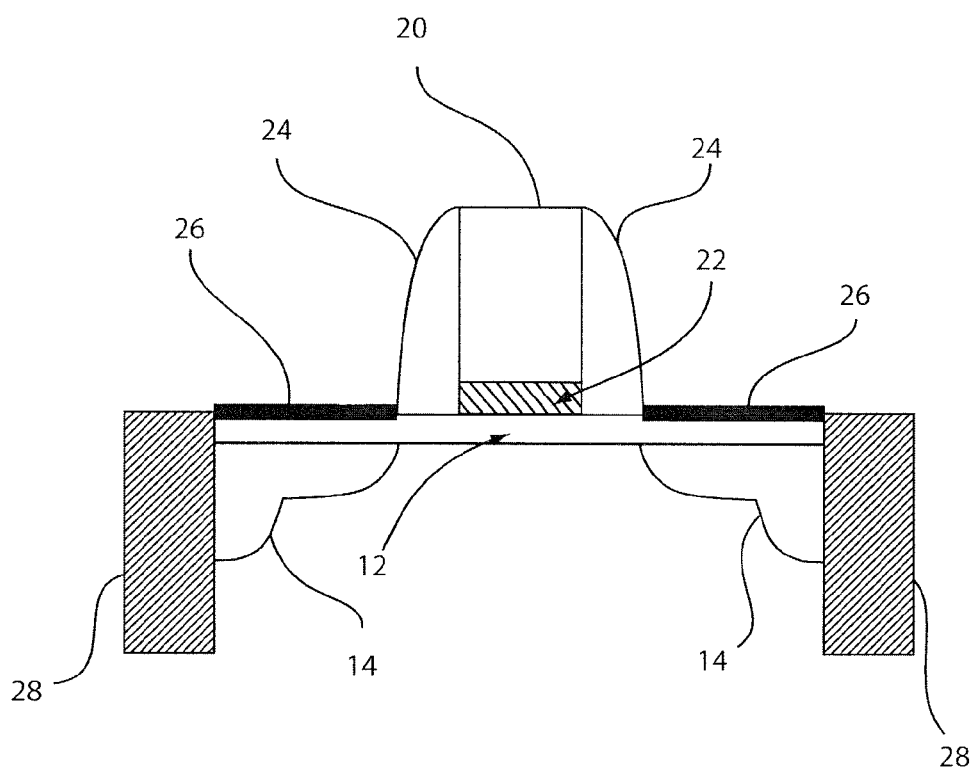
FIG. 1 is a cross-sectional view of a SiGe-channel MOSFET for demonstrating the present principles.

A device, layout and fabrication method are disclosed to transform a biaxial compressive strain in, e.g., a SiGe-channel p-type metal oxide semiconductor field effect transistor (PMOSFET) into a uniaxial compressive strain device by employing a proper layout design. To achieve uniaxial strain, PMOSFETs are fabricated on long and narrow active regions and the embedded source/drain SiGe process is replaced by a raised source/drain SiGe.

The present principles provide a method to fabricate SiGe-channel PMOSFETs on long and narrow active regions. The channel is under uniaxial compressive strain, with stress levels, e.g., reaching and even exceeding 2 GPa. The strain achieved is independent of transistor pitch, and is applicable and scalable for future technology nodes. The conventional embedded SiGe process is replaced by a raised SiGe to avoid strain relaxation and benefit from the lower contact resistance of the SiGe source/drain (S/D) regions. To minimize any parasitic capacitance penalty imposed by the raised SiGe structure, a faceted epitaxy is preferably employed to form this raised layer.

With a proper layout design, it is possible that many PMOSFETs can share a single active area, so that the active area can be made long enough (e.g., 2 microns or more) and the strain in the channel direction is preserved. In this way, SiGe-channel MOSFETs with significantly high uniaxial compressive strain can be made.

It is to be understood that the present invention will be described in terms of a given illustrative architecture formed on a semiconductor wafer; however, other architectures, structures, substrate materials and process features and steps may be varied within the scope of the present invention.

The devices and circuits as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1, a cross-sectional view of a SiGe-channel metal oxide semiconductor field effect transistor (MOSFET) 10 is illustratively depicted. The transistor 10 includes a gate electrode 20 and a gate dielectric 22. The gate electrode 20 has spacers 24 formed on sidewalls thereof. Active areas included at a surface of source/drain regions 14 include a silicided layer 26 formed. Shallow trench isolation (STI) regions 28 are provided between devices to reduce parasitic current and charge buildup. For a logic transistor 10, a channel 12 has a very small width. So, for an individual transistor, the strain in the SiGe channel 12 is fully relaxed.

In accordance with the present principles, if an active area is made long enough, the strain in the transport direction is not relaxed. For a wide transistor, SiGe in a channel is under biaxial compressive strain. Although this strain configuration leads to a significant hole mobility increase, carrier velocity and in turn device drive current is not significantly increased. On the other hand, for narrow devices the strain perpendicular to the channel is relaxed. So, a SiGe channel is under uniaxial compressive strain, which leads to reduction in the transport effective mass and increases in the drive current.

Figures 2A, 2B:
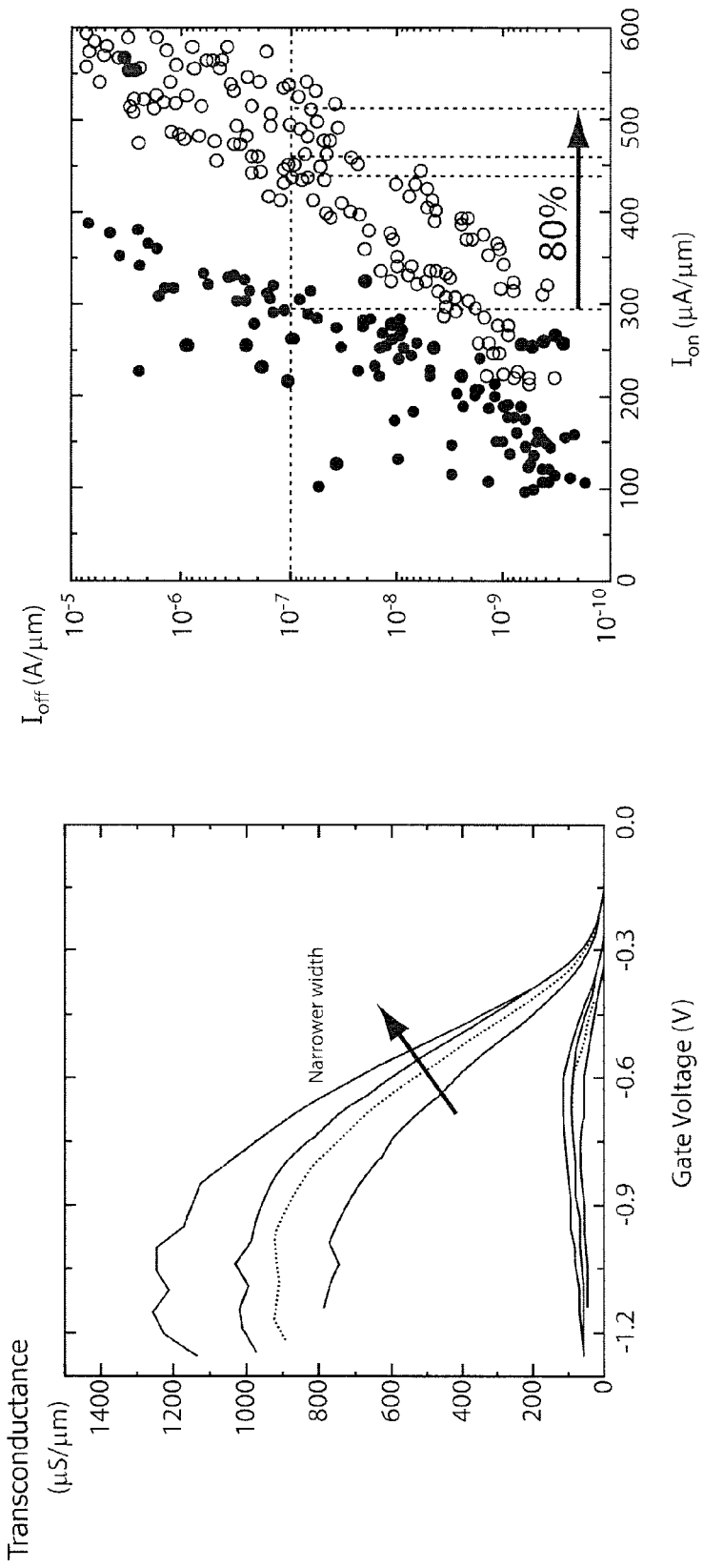
FIG. 2A is a plot of transconductance versus gate voltage showing the impact of a narrow width on device performance.
FIG. 2B is a scatter plot of $I_{off}$ versus $I_{on}$ showing the impact of a narrow width on device performance.

Referring to FIG. 2A, a family of curves are plotted for transconductance ($S/\mu m$) versus gate voltage (V). The curves show an increase in saturation transconductance with decreased channel width (e.g., a 55% increase). In FIG. 2B, a scatter plot of off current ($I_{off}(A/\mu m)$) versus drive current ($I_{on}(A/\mu m)$) for a device is illustratively shown. More than an 80% increase in the drive current is shown as the channel width is reduced.

Figure 3A:
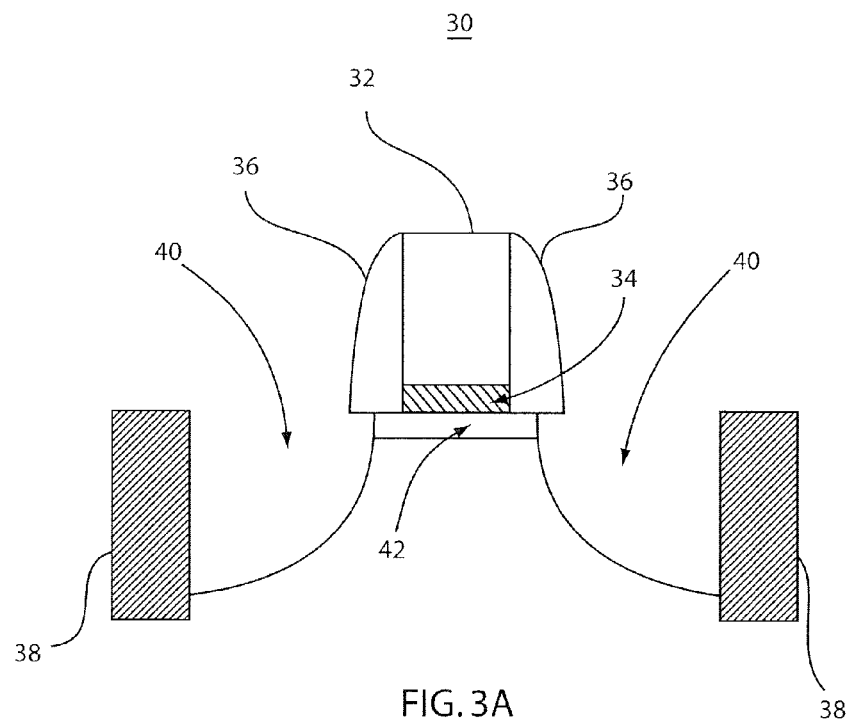
FIG. 3A is a cross-sectional view of a conventional device having recesses formed adjacent to a channel which relax the channel material.
Figure 3B:
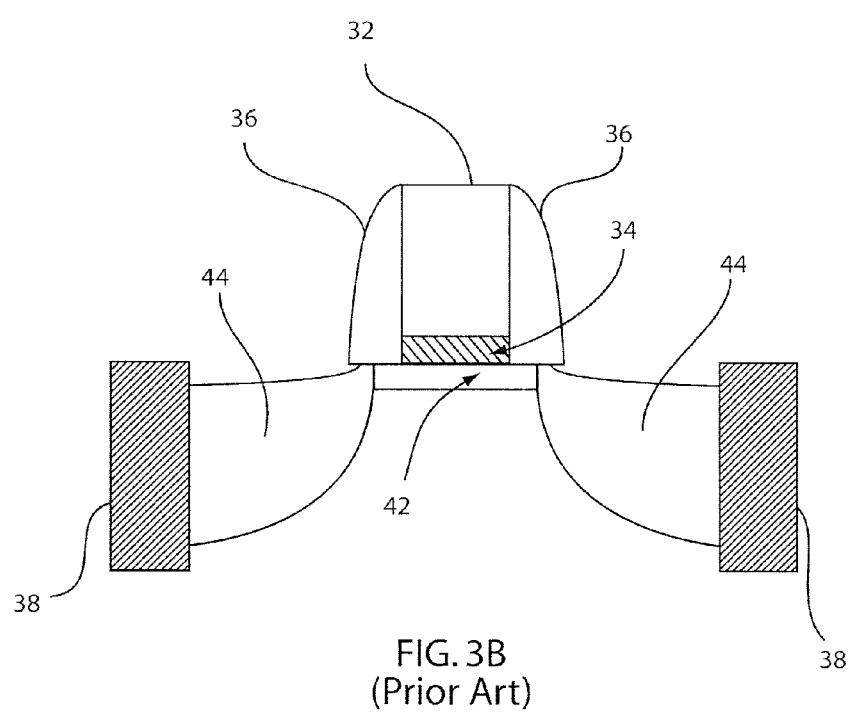
FIG. 3B is a cross-sectional view of the conventional device of FIG. 3B having embedded source/drain regions formed in the recesses formed adjacent to the channel

Referring to FIG. 3A, an embedded SiGe process is illustratively described to provide comparisons. A cross-sectional view of a SiGe-channel MOSFET 30 is illustratively depicted. The transistor 30 includes a gate electrode 32 and a gate dielectric 34. The gate electrode 32 has spacers 36 formed on sidewalls thereof. Shallow trench isolation (STI) regions 38 are provided between devices to reduce parasitic current and charge buildup. A first recess 40 is made in a source/drain area. During this step, the strain in a SiGe channel 42 is fully relaxed. When the recess 40 is filled with the embedded SiGe 44 in FIG. 3B, uniaxial compressive strain is applied to the channel 42. However, since the channel 42 is already relaxed and the lattice constant of the channel and embedded SiGe are not very different, the amount of strain transferred to the channel is not significant.

Figure 4A:
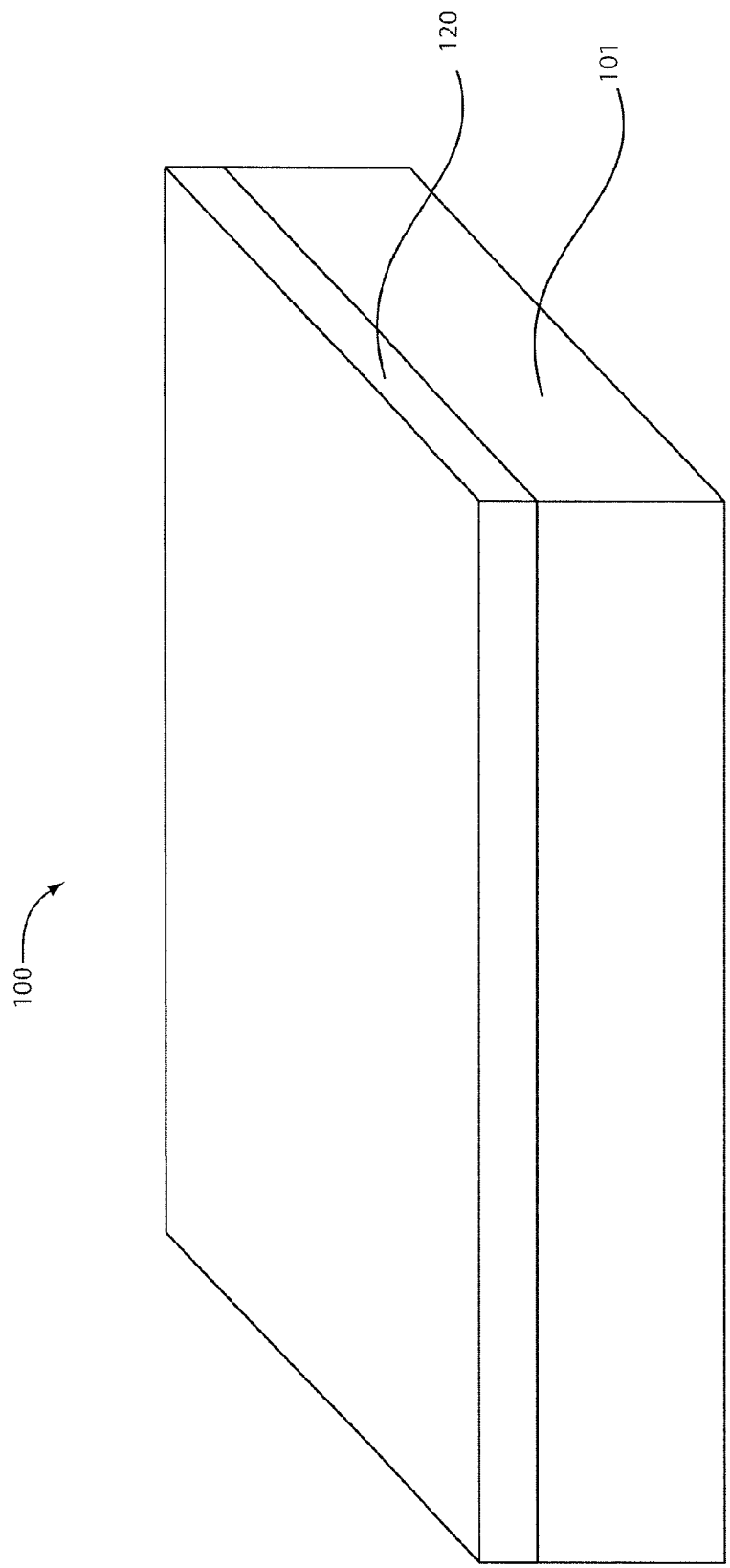
FIG. 4A is a perspective view of a device having a substrate with a strained layer provided thereon in accordance with one illustrative embodiment.

Referring to FIG. 4A, a perspective view of a semiconductor device 100 is illustratively depicted in accordance with the present principles. A substrate 101 may include a Semiconductor-on-Insulator (SOI) or bulk substrate that may include Gallium Arsenide, monocrystalline silicon, Germanium, or any other material or combination of materials where the present principles may be applied. In some embodiments, the substrate 101 further comprises other features or structures that are formed on or in the semiconductor substrate in previous process steps. A strained semiconductor layer 120 is formed in or on substrate 101 or is bonded to substrate 101.

Figure 4B:
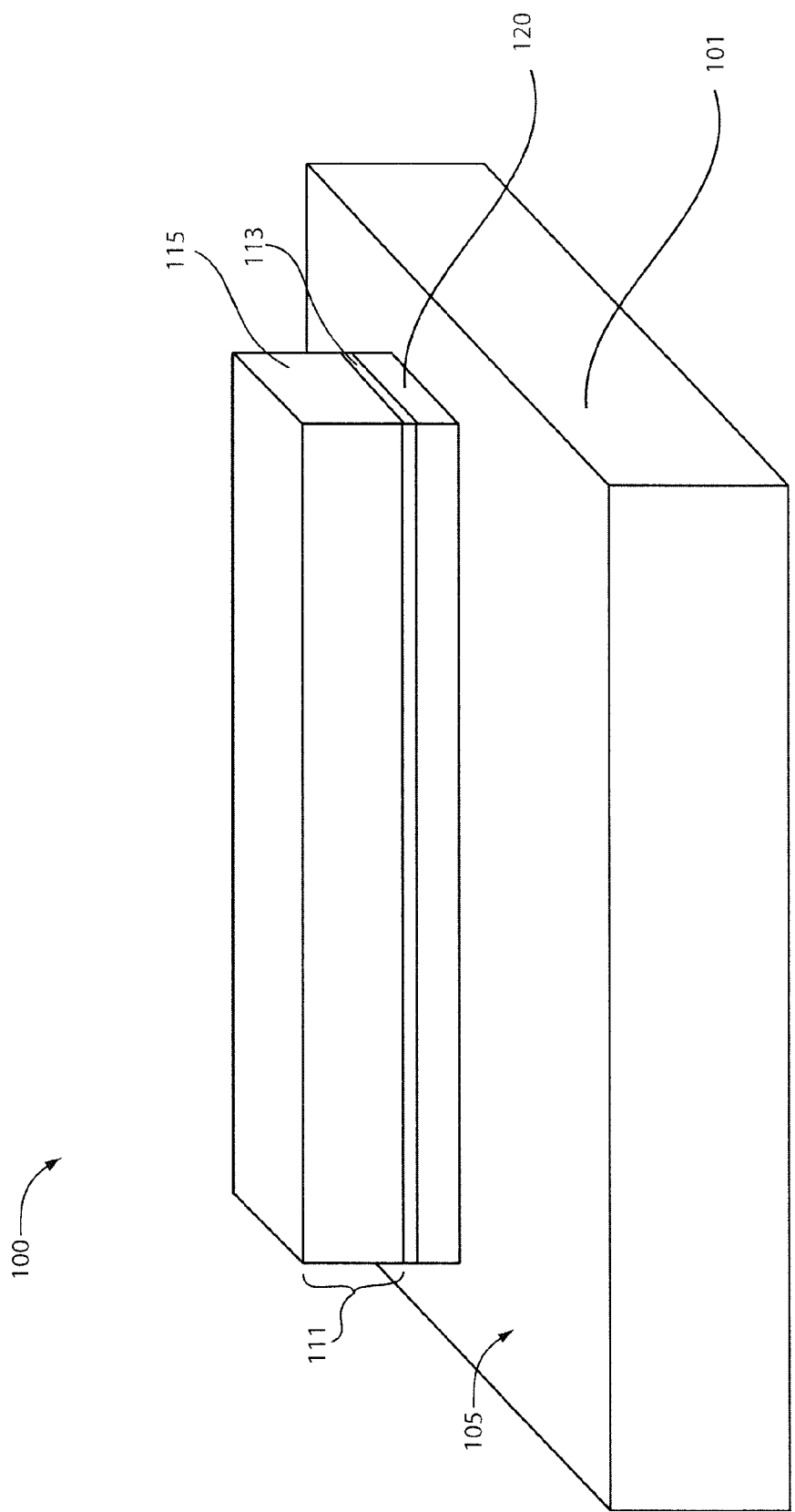
FIG. 4B is a perspective view of the device of FIG. 4A having an active region patterned from the strained layer in accordance with one illustrative embodiment.

Referring to FIG. 4B, a shallow trench isolation (STI) region is formed by conventional methods. This may include first forming a mask layer 111. The mask layer 111 may include growing a thin thermal oxide 113 of about 2-8 nm of the strained semiconductor layer 120, and then depositing a silicon nitride film 115 of about 40-80 nm thick (pad nitride). Layer 113 and 115 are formed over the entire surface of layer 120. Next, a photoresist material is deposited (not shown) and employed to pattern the mask layer 111, which is, in turn, employed to pattern an active region formed in the strained semiconductor layer 120. FIG. 4B shows a strained narrow and long region 121 formed for pFETs after etching layer 120 using the mask layer 111 (e.g., the pad nitride 115 and pad oxide 113 layers). The strained layer 120 and unstrained layer 101 are etched to form shallow trenches 105. Next, a thin oxide liner can be created followed by deposition of $SiO_2$ and planarization by chemical mechanical polishing (CMP) to form the shallow trench regions 103 (shown in FIG. 4C).

Figure 4C:
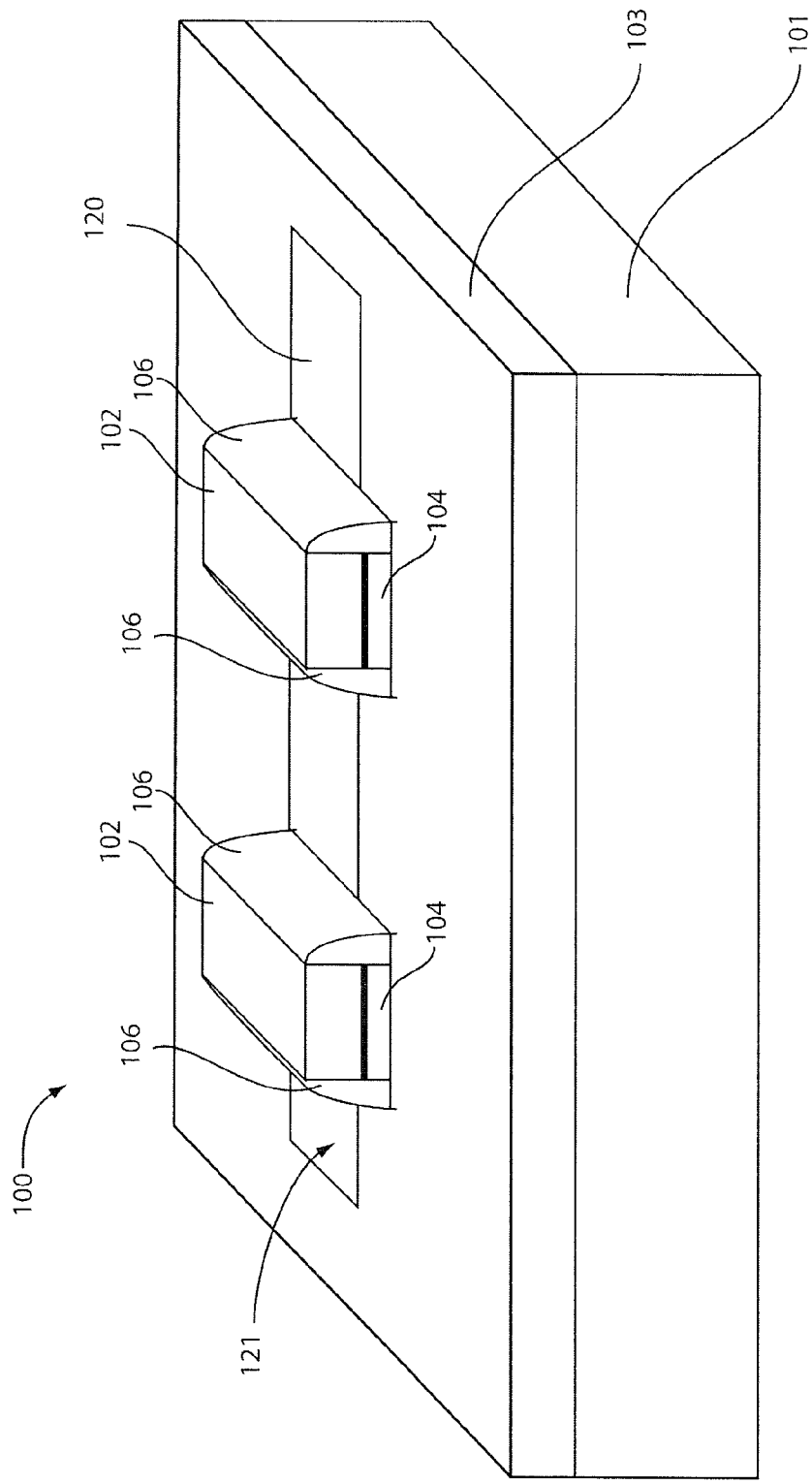
FIG. 4C is a perspective view of the device of FIG. 4B showing shallow trench isolation and gate structures formed of the active region in accordance with one illustrative embodiment.

Referring to FIG. 4C, layer 120 may include a biaxial compressive strain. In one embodiment, layer 120 includes SiGe strained in accordance with preferred performance criteria. In one embodiment, the strain in layer 120 corresponds to stresses in the GPa range and in particular up to about 2 GPa. The strain is preferably in a direction of a channel, especially in, e.g., a SiGe-channel p-type metal oxide semiconductor field effect transistor (PMOSFET). The strain is preferably a uniaxial compressive strain. To achieve uniaxial strain, PMOSFETs are fabricated on long and narrow active regions 120. The device 100 includes gate electrodes 102 and gate dielectric 104. The gate electrode 102 may include any suitable conductive material, e.g., polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The gate electrode 102 may further comprise dopants that are incorporated during or after deposition.

The gate dielectric 104 may include a silicon oxide, silicon nitride, silicon oxynitride, organic dielectric, etc. In preferred embodiment, gate dielectric 104 include a high dielectric constant material, such as, e.g., metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, any suitable combination of those high-k materials, or any suitable combination of any high-k material with silicon oxide, silicon nitride, and/or silicon oxynitride.

The gate structure includes spacers 106 formed on sidewalls thereof. The spacers 106 may include a nitride, for example. Regions 121 will form a transistor channel. Shallow trench isolation (STI) regions 103 are provided between devices to reduce parasitic current and charge buildup. STI regions 103 may include an oxide, e.g., a silicon oxide.

The present principles provide a method to fabricate SiGe-channel PMOSFETs on long and narrow active regions. The channel (formed in layer 120) is under uniaxial compressive strain, with stress levels, e.g., reaching and even exceeding 2 GPa. The strain achieved is independent of transistor pitch, and is applicable/scalable for future technology nodes.

With a proper layout design, many PMOSFETs can share a single active area in region 120, so that the active area can be made long enough (e.g., 2 microns or more) and the strain in the channel direction is preserved. In this way, SiGe-channel MOSFETs with significantly high uniaxial compressive strain can be made.

Figure 5:
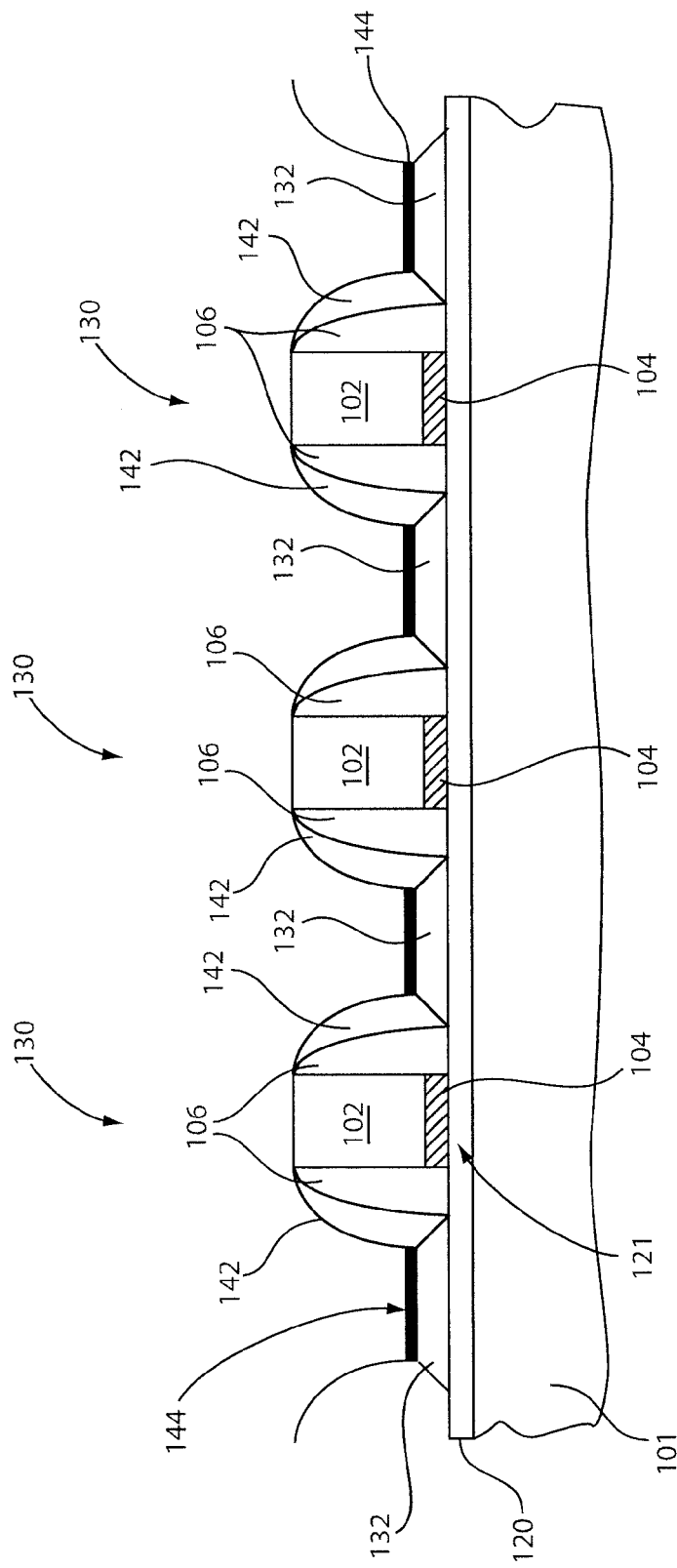
FIG. 5 is a cross-sectional view of a device having raised source/drain regions formed on the channel layer in accordance with the present principles.

Referring to FIG. 5, a cross-sectional view of transistors 130 having strained channels and raised source/drain regions 132 is shown. The conventional embedded active area process (FIG. 3B) is eliminated. Raised source/drain regions 132 are grown on semiconductor layer 120 to avoid strain relaxation and benefit from lower contact resistance of the source/drain regions 132. To minimize any parasitic capacitance penalty imposed by the raised regions 132 structure, a faceted epitaxy is preferably employed to form this raised layer. Faceted epitaxy may include eptiaxially growing SiGe or other materials on layer 120 between transistors 130.

In one embodiment, SiGe-channel PMOSFETs are fabricated on the long and narrow active area 120, so that a channel 121 is naturally under uniaxial compressive strain. The width of the channel may be selected, but is preferably determine in accordance with a minimum features size achievable by the technology. The fabrication process may proceed as in conventional SiGe-channel process with the embedded SiGe step skipped to avoid strain relaxation in the channel SiGe. Instead, the raised layer 132 is epitaxially grown in the source/drain area.

In one embodiment, layer 132 may be in-situ doped with high boron concentration or could be implanted with boron, $BF_2$, or another p-type dopant followed by an anneal process. The epitaxially grown material may include, e.g., SiGe, however other materials such as pure germanium, pure silicon or other semiconductor material, may be employed. To reduce any possible penalty in parasitic capacitance due to the raised source/drain structure, a faceted epitaxy process is preferably employed.

In one embodiment, the growth of SiGe raised source/drain regions 132 (optionally in-situ doped) on heavily doped SiGe of layer 120 is provided. Such a process has been a challenge for at least two reasons: 1) conventional epitaxy employs a hydrogen pre-bake at high temperatures, which may result in a poor SiGe surface; and 2) boron in heavily doped Si or SiGe diffuses to the native oxide and makes it difficult to remove native oxide with HF. Both problems can be resolved by a low-temperature in-situ clean process.

A second spacer 142 is formed, and then silicide 144 is formed on the raised regions 132. The spacer may include nitride. The rest of the process continues employing known processes. Other methods used in CMOS processes to apply mechanical stress to the channel, such as stress liners, can be used to further increase the strain in the channel and increase the device performance.

Figure 6:
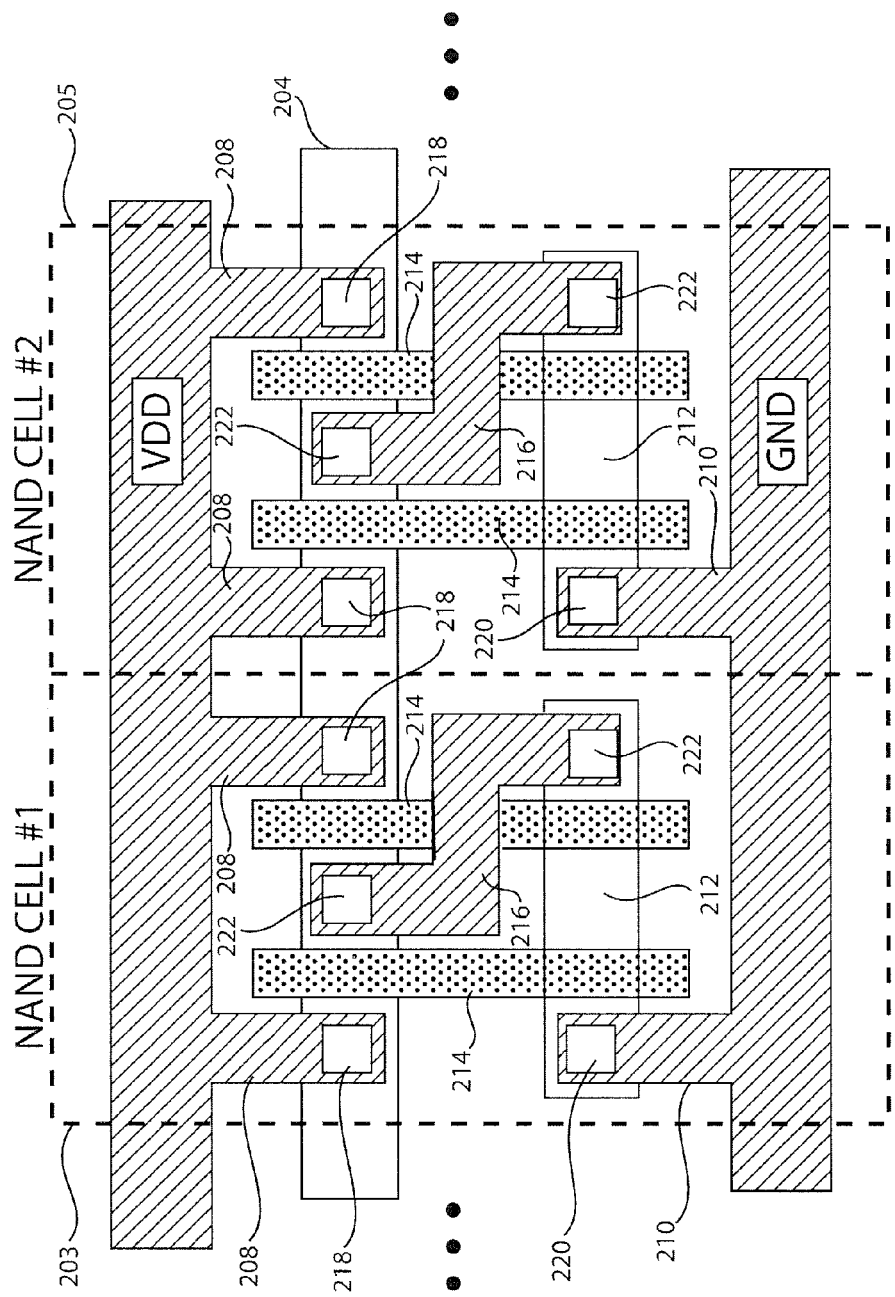
FIG. 6 is a layout showing two NAND gate devices sharing active areas in accordance with the present principles.

Referring to FIG. 6, to take advantage of a layout, multiple transistors 202 are preferably formed on a long and narrow active area 204 (e.g., including the features of active area 120). This can be achieved for a CMOS circuit 200, e.g., composed of NAND gates 203 and 205. NAND logic gates 203 and 205 with an even number of inputs 208 and 210 can be attached from both sides. NAND gates with an odd number of inputs and other logic gates can be attached at least from one side to the neighboring cells, to share a long active area.

In addition to active area 204, gates 203 and 205 include active areas 212, gate structures 214 and interconnection conductors 216. Contacts 218 make connections between a supply rail (VDD) and S/D regions of active areas 204 for inputs 208. Contacts 220 make connections between a ground rail (GND) and S/D regions of active areas 212 for inputs 210. Contacts 222 make connections between active areas 204 and active areas 212 for interconnection conductors 216.

Figure 7:
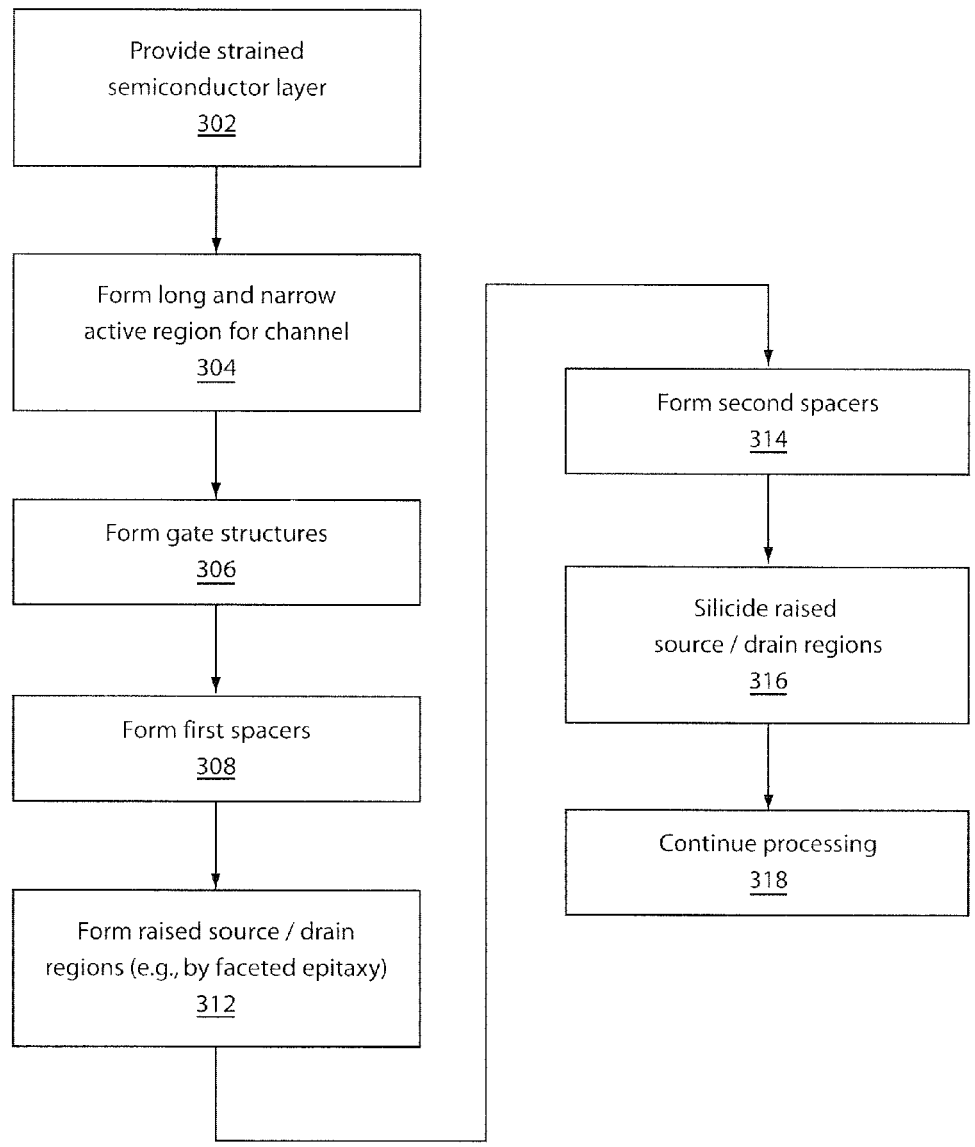
FIG. 7 is a flow diagram showing an illustrative method for fabricating a transistor in accordance with the present principles.

Referring to FIG. 7, a flow diagram shows an illustrative method for fabricating a semiconductor device. In block 302, a strained semiconductor layer having a first strained axis is provided. This may include providing a strained SiGe layer having a uniaxial compressive strain along the first strained axis.

In block 304, an active region is formed within a surface of the strained semiconductor layer where the active region has a longitudinal axis along the strained axis. The active region may include a length of 2 microns, but other lengths are also contemplated that provide the desired strain to yield sufficient performance of the device being fabricated. The active region is preferably shared among a plurality of transistors.

In block 306, gate structures are formed over the active region, e.g., gate dielectric, gate conductor, etc. In block 308, first spacers are formed on the gate structures. In block 312, raised source/drain regions are formed on the active regions above and over the surface of the strained semiconductor layer and adjacent to the gate structures to form transistor devices. The raised source/drain regions are preferably epitaxially grown and more preferably grown using a faceted epitaxial growth process. The epitaxial growth process may include in-situ doping, or doping may be performed after the formation of raised source/drain regions.

In block 314, second spacers are formed over the first spacers and a portion of the raised source/drain regions. In block 316, the raised source/drain regions are silicided. In block 318, processing continues to complete the semiconductor device and/or chip.

Having described preferred embodiments for a device structure, layout and fabrication method for uniaxially strained transistors (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
a strained semiconductor layer having a first strained axis;
an active region formed within a surface of the strained semiconductor layer where the active region has a longitudinal axis along the strained axis, wherein the active region includes a length of at least 2 microns;
gate structures formed over the active region;
first spacers formed on the gate structures;
raised source/drain regions formed only above an entire active region, wherein the raised source and drain region are above an upper surface of the entire active region that is in direct contact with a gate dielectric of the gate structure, and the raised source/drain regions are adjacent to the gate structures to form transistor devices; and
second spacers formed over the first spacers and a portion of the raised source/drain regions.

2. The device as recited in claim 1, further comprising a dielectric material formed around the active region.

3. The device as recited in claim 1, wherein the strained semiconductor layer includes a strained SiGe layer having a uniaxial compressive strain along the first strained axis.

4. The device as recited in claim 1, further comprising a plurality of transistors wherein the plurality of transistors share the same active region.

5. The device as recited in claim 1, wherein the raised source/drain regions include faceted epitaxial grown source/drain regions.

6. The device as recited in claim 1, wherein the transistor devices includes p-type field effect transistors.

7. A semiconductor device, comprising:
a strained semiconductor layer having a first strained axis with a uniaxial compressive strain;
an active region formed within a surface of the strained semiconductor layer where the active region has a longitudinal axis along the strained axis, wherein the active region includes a length of at least 2 microns;
gate structures formed over the active region;
first spacers formed on the gate structures;
raised source/drain regions formed only above an entire active region, wherein the raised source and drain region are above an upper surface of the entire active region that is in direct contact with a gate dielectric of the gate structure, and the raised source/drain regions are adjacent to the gate structures to form transistor devices; and
second spacers formed over the first spacers and a portion of the raised source/drain regions.

8. The device as recited in claim 7, further comprising a dielectric material formed around the active region.

9. The device as recited in claim 7, wherein the strained semiconductor layer includes a strained SiGe layer.

10. The device as recited in claim 7, wherein the active region includes a length of at least 2 microns.

11. The device as recited in claim 7, further comprising a plurality of transistors wherein the plurality of transistors share the same active region.

12. The device as recited in claim 7, wherein the raised source/drain regions include faceted epitaxial grown source/drain regions.

13. A semiconductor device, comprising:
a strained semiconductor layer of SiGe having a first strained axis;
an active region formed within a surface of the strained semiconductor layer where the active region has a longitudinal axis along the strained axis, wherein the active region includes a length of at least 2 microns;
dielectric material formed around the active region;
gate structures formed over the active region;
first spacers formed on the gate structures;
raised source/drain regions formed only above an entire active region, wherein the raised source and drain region are above an upper surface of the entire active region that is in direct contact with a gate dielectric of the gate structure, and the raised source/drain regions are adjacent to the gate structures to form transistor devices; and
second spacers formed over the first spacers and a portion of the raised source/drain regions.

14. The device as recited in claim 13, wherein the strained semiconductor layer has a uniaxial compressive strain.

15. The device as recited in claim 13, further comprising a plurality of transistors wherein the plurality of transistors share the same active region.

16. The device as recited in claim 13, wherein the raised source/drain regions include faceted epitaxial grown source/drain regions.

* * * * *